(12) United States Patent
Kwon et al.

(10) Patent No.: US 8,525,273 B2
(45) Date of Patent: Sep. 3, 2013

(54) INTEGRATED CIRCUIT DEVICES INCLUDING DEVICE ISOLATION STRUCTURES AND METHODS OF FABRICATING THE SAME

(75) Inventors: Oh-kyum Kwon, Suwon-si (KR); Tae-jung Lee, Yongin-si (KR); Sun-hyun Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 222 days.

(21) Appl. No.: 13/017,984

(22) Filed: Jan. 31, 2011

(65) Prior Publication Data

US 2011/0248357 A1 Oct. 13, 2011

(30) Foreign Application Priority Data

Apr. 9, 2010 (KR) .................. 10-2010-0032783

(51) Int. Cl.
 *H01L 27/088* (2006.01)
(52) U.S. Cl.
 USPC ........... 257/392; 257/127; 257/374; 257/397; 257/510; 257/513; 257/E23.022
(58) Field of Classification Search
 USPC ................. 257/127, 374, 392, 397, 510, 513, 257/E23.022
 See application file for complete search history.

(56) References Cited

U.S. PATENT DOCUMENTS 5,420,062 A * 5/1995 Inada et al. ................... 438/228
2005/0059215 A1* 3/2005 Kim et al. ..................... 438/275

FOREIGN PATENT DOCUMENTS

| JP | 2001-156260 | | 6/2001 |
| KR | 1020030060514 A | | 7/2003 |
| KR | 100650262 B1 | | 11/2006 |

* cited by examiner

*Primary Examiner* — Tan N Tran
(74) *Attorney, Agent, or Firm* — Myers Bigel Sibley & Sajovec

(57) ABSTRACT

An integrated circuit device includes a substrate having adjacent first and second regions, and a device isolation structure in the substrate between the first and second regions. The first and second regions of the substrate may respectively include transistors configured to be driven at different operational voltages, and the device isolation structure may electrically separates the transistors of the first region from the transistors of the second region. The device isolation structure includes outer portions immediately adjacent to the first and second regions and an inner portion therebetween. The outer portions of the device isolation structure comprise a material having an etching selectivity with respect to that of the inner portion. Related devices and fabrication methods are also discussed.

16 Claims, 16 Drawing Sheets

INTEGRATED CIRCUIT DEVICES INCLUDING DEVICE ISOLATION STRUCTURES AND METHODS OF FABRICATING THE SAME

CROSS-REFERENCE TO RELATED APPLICATIONS

This application claims priority from Korean Patent Application No. 10-2010-0032783, filed on Apr. 9, 2010, in the Korean Intellectual Property Office, the disclosure of which is incorporated by reference herein in its entirety.

BACKGROUND

Embodiments of inventive concept relate to semiconductor devices and methods of manufacturing the same, and more particularly, to semiconductor devices including devices having a plurality of operational voltages, and methods of manufacturing the same.

Integrated circuit devices may be formed on a surface of a semiconductor substrate. Metal oxide semiconductor (MOS) devices constituting semiconductor circuits may be separated from each other by a device isolation layer structure formed near a surface of the semiconductor substrate. The device isolation layer may include a field oxide layer formed using a local oxidation of silicon (LOCOS) method, and/or a shallow trench isolation (STI) layer formed using a STI method, in which an insulating layer buried in a trench is used. The STI layer may provide a substantially flat surface for post-processing without having a "bird's beak", in contrast to a field oxide layer formed using the LOCOS method, and thus the STI layer may be used as an alternative for a field oxidation layer to cope with the size of the semiconductor integrated circuits being reduced to an order of sub-microns or less.

Due to recent developments in semiconductor manufacturing technology, a plurality of field effect transistors (FETs) operating at different threshold voltages may be provided in a single semiconductor device, and semiconductor devices that are compact and perform various functions are gaining attention. For example, the semiconductor device may include logic devices, memory devices such as dynamic random access memory (DRAM) devices and/or static random access memory (SRAM) devices, digital signal processors, and/or devices in which these devices are converged. The STI layer may be used for the integration of such semiconductor devices.

SUMMARY

Embodiments of the inventive concept provide semiconductor devices including a device isolation layer structure that has sufficient corrosion resistance and durability with respect to an operation of forming gate insulation layers having different thicknesses so as to respond to an increased integration degree, in order to form field effect transistors (FETs) that operate at different threshold voltages in a single semiconductor chip and capable of increasing a yield and forming metal oxide semiconductor (MOS) devices having excellent reliability.

Embodiments of the inventive concept also provide methods of manufacturing semiconductor devices including a device isolation layer structure, in which a device isolation layer structure having the above-described advantages may be easily manufactured.

According to some embodiments of the inventive concept, an integrated circuit device includes a substrate including adjacent first and second regions, and a device isolation structure in the substrate between the first and second regions. For example, the first and second regions of the substrate may respectively include transistors configured to be driven at different operational voltages, and the device isolation structure may electrically separate the transistors of the first region from the transistors of the second region. The device isolation structure includes outer portions immediately adjacent to the first and second regions and an inner portion therebetween. The outer portions of the device isolation structure may be formed of a material having an etching selectivity with respect to that of the inner portion.

In some embodiments, the outer portions of the device isolation structure may be first and second insulating layers extending into respective trenches in the substrate, and the inner portion may be a guard ring region extending between the first and second insulating layers.

In some embodiments, the guard ring region may be a portion of the substrate extending between the respective trenches including the first and second insulating layers therein.

In some embodiments, the guard ring region may have a different conductivity type than well portions of the first and/or second regions of the substrate.

In some embodiments, the device isolation structure may completely surround the first region of the substrate in plan view to electrically separate the first region from the second region of the substrate.

In some embodiments, the first and second regions of the substrate may respectively include first and second gate insulating layers thereon. The first and second gate insulating layers may have different thicknesses.

In some embodiments, the guard ring region may be formed of a material having an etching selectivity with respect to that of the first and second gate insulating layers. A boundary between the first and second gate insulating layers may be provided on the guard ring region.

In some embodiments, the transistors of the first region may include the first gate insulating layer, and may be driven at first operational voltage. The transistors of the second region may include the second gate insulating layer, and may be driven at a second operational voltage greater than the first operational voltage. A second thickness of the second gate insulating layer may be greater than a first thickness of the first gate insulating layer.

In some embodiments, the substrate may include a third region including transistors thereon configured to be driven at a third operational voltage that is greater than the first and second operational voltages. The device may further include a second device isolation structure in the substrate between the second and third regions. The second device isolation structure may electrically separate transistors of the second region from transistors of the third region.

In some embodiments, the second device isolation structure may include outer portions immediately adjacent to the second and third regions and an inner portion therebetween. The outer portions of the second device isolation structure may be formed of a material having an etching selectivity with respect to that of the inner portion. For example, the outer portions of the second device isolation structure may be third and fourth insulating layers extending into respective trenches in the substrate, and the inner portion of the second device isolation structure may be a portion of the substrate extending between the respective trenches including the third and fourth insulating layers.

According to further embodiments of the inventive concept, there is provided a semiconductor device comprising: a semiconductor substrate having a first voltage region configured to be driven at a first voltage and a second voltage region disposed adjacent to the first voltage region and configured to be driven at a second voltage; a first field effect transistor (FET) that is disposed on the first voltage region and includes a first gate insulating layer having a first thickness; a second FET that is disposed on the second voltage region and includes a second gate insulating layer having a second thickness; and a device isolation layer structure that electrically separates the first and second voltage regions, wherein the device isolation layer structure includes first and second trenches separated apart by a predetermined distance in the semiconductor substrate, electrically insulating layers respectively buried in the first and second trenches, and a guard ring region formed between the first and second trenches.

In some embodiments, the guard ring region may be a portion of the semiconductor substrate between the first and second trenches. The second voltage may be higher than the first voltage, and the second thickness is greater than the first thickness. The predetermined distance between the first and second trenches may be in a range of about 0.2 micrometers (μm) to about 1.0 micrometers (μm). The first and second voltage regions may be formed in a well of the same conductivity type in the semiconductor substrate.

In some embodiments, the semiconductor device may include a logic device, a memory device, a digital signal processor, a driving driver, and a sensor. A boundary region between the first and second gate insulating layers may be formed on the guard ring region.

According to some embodiments, at least one of the first and second field-effect transistors may be a plane-type or three-dimensional transistor. At least one of the first and second gate insulating layers may comprise a high-k thin film or at least two dielectric stacking layers.

According to still further embodiments of the inventive concept, there is provided a semiconductor device comprising: a semiconductor substrate including a low voltage region, a middle voltage region, and a high voltage region; a low voltage field effect transistors (FET) including a low voltage gate insulating layer disposed on the low voltage region; a middle voltage FET including a middle voltage gate insulating layer disposed on the middle voltage region; a high voltage FET including a high voltage gate insulating layer disposed on the high voltage region; and at least one device isolation layer structure that electrically separates two adjacent regions among the low voltage region, the middle voltage region, and the high voltage region, wherein the at least one device isolation layer structure includes first and second trenches separated apart by a predetermined distance in the semiconductor substrate, electrically insulating layers respectively buried in the first and second trenches, and a guard ring region formed between the first and second trenches.

The device isolation layer structure including the guard ring region may be disposed between the low voltage region and the middle voltage region.

According to yet further embodiments of the inventive concept, a method of fabricating an integrated circuit device includes providing a substrate including a first region and a second region adjacent to the first region. The first region is configured to be driven at a first voltage, and the second voltage region is configured to be driven at a second voltage different from the first voltage. A device isolation structure is formed in the substrate between the first and second regions. The device isolation structure includes outer portions immediately adjacent to the first and second regions, and an inner portion therebetween. The outer portions of the device isolation structure may be formed of a material having an etching selectivity with respect to that of the inner portion.

In some embodiments, forming the device isolation layer may include forming first and second trenches that are separated apart by a predetermined distance between the first and second voltage regions of the semiconductor substrate; and forming electrically insulating layers in the first and second trenches, wherein the device isolation layer structure includes a guard ring region that is formed on a portion of the semiconductor substrate and interposed between the electrically insulating layers and the first and second trenches.

According to still further embodiments of the inventive concept, there is provided a method of manufacturing a semiconductor device, the method comprising: providing a semiconductor substrate including a low voltage region, a middle voltage region, and a high voltage region; forming first and second trenches separated apart by a predetermined distance, between two adjacent regions among the low voltage region, the middle voltage region, and the high voltage region; and forming a device isolation layer structure by burying electrically insulating layers in the first and second trenches, wherein the device isolation layer structure includes a guard ring region that is formed on a portion of the semiconductor substrate and interposed between the electrically insulating layers and the first and second trenches.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
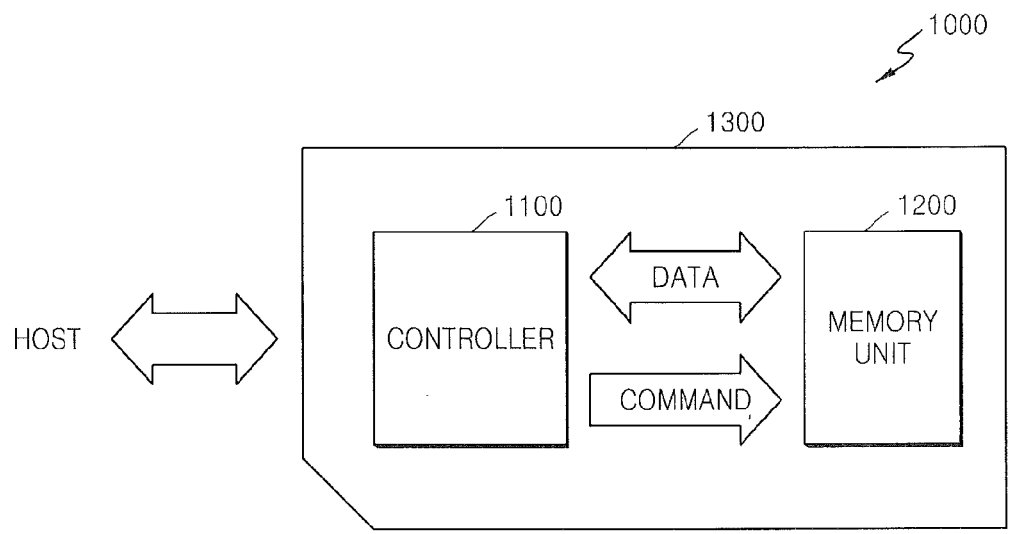
FIG. 1 is a block diagram illustrating a memory card according to some embodiments of the inventive concept.

Hereinafter, exemplary embodiments of the inventive concept will be described with reference to the accompanying drawings. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to those of ordinary skill in the art. In the drawings, the lengths and sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

The terms 'wafers' and 'substrates' may refer to semiconductor layers formed on a base structure such as silicon, a silicon-on-insulator (SOI), or a silicon-on-sapphire (SOS), a doped or undoped semiconductor layer, and/or a deformed semiconductor layer. Also, the terms 'wafers' and 'substrates' are not limited to silicon-based materials, and may include Group III-V semiconductor materials such as silicon-germanium, germanium, and/or gallium-arsenic compounds.

FIG. 1 is a block diagram illustrating a memory card 1000 according to an example embodiment of the inventive concept.

Referring to FIG. 1, the memory card 1000 may include a controller 1100 and a memory unit 1200 in a housing 1300, and the controller 1100 and the memory unit 1200 may exchange electrical signals. For example, the memory unit 1200 and the controller 1100 may exchange data based on a command from the controller 1100. The memory card 1000 may store data in the memory unit 1200 and output data from the memory unit 1200 to an external device such as a host. The memory card 1000 may be removably inserted into the host as a slot card so as to communicate with an external host. For example, the memory card 1000 may include commercially available CompactFlash™ (CF) cards, multimedia cards (MMC), secure digital (SD) cards, smart media cards, and/or personal tags (P-Tag), but are not limited thereto.

Figure 2:
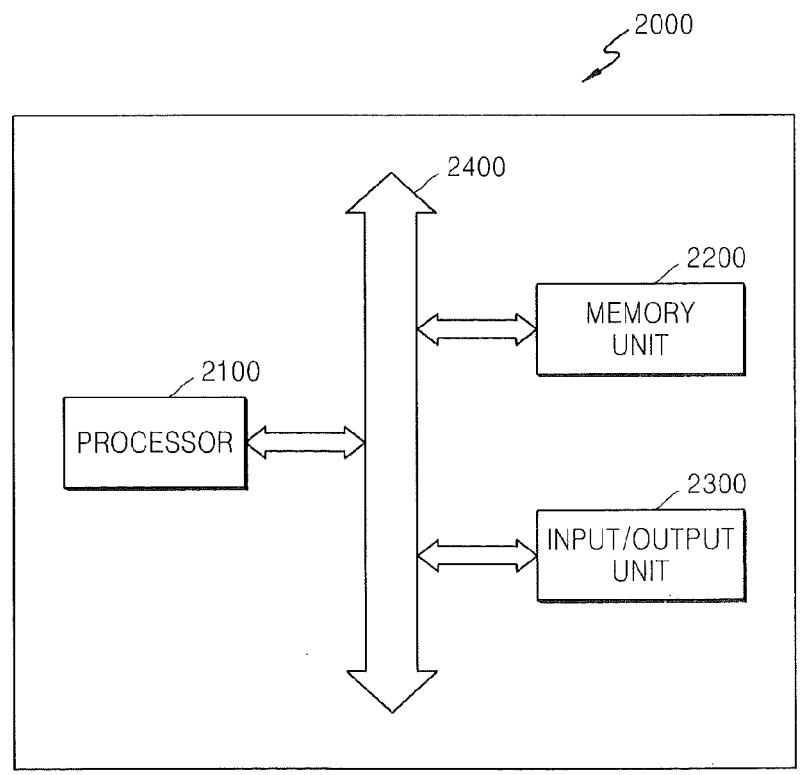
FIG. 2 is a block diagram illustrating an electronic system according to some embodiments of the inventive concept.

FIG. 2 is a block diagram illustrating an electronic system 2000 according to an example embodiment of the inventive concept.

Referring to FIG. 2, the electronic system 2000 may include a processor 2100, a memory unit 2200, and an input/output unit 2300. The processor 2100, the memory unit 2200, and the input/output unit 2300 may perform data communication with one another via a bus 2400. The processor 2100 may execute programs and control the electronic system 2000. The input/output unit 2300 may input to the electronic system 200 and output data from the electronic system 2000. The electronic system 2000 may be connected to an external device such as a personal computer or a network via the input/output unit 2300 to exchange data with the external device. The memory unit 2200 may store codes and data for an operation of the processor 2100.

For example, the electronic system 2000 may include various electronic control devices including a memory unit. For example, the electronic system 2000 may be a micro-controller, a mobile phone, a MP3 player, a navigation device, a solid state drive (SSD), or household appliances.

Figure 3:
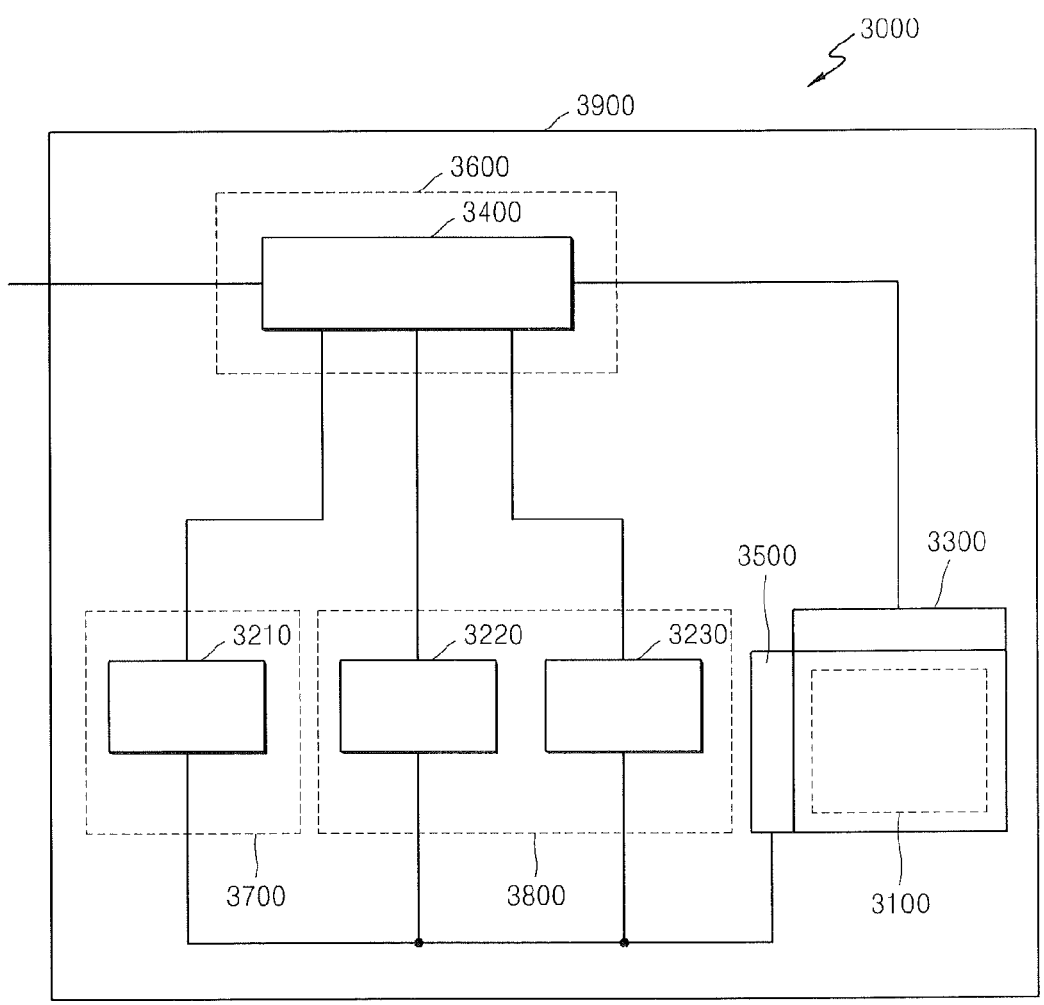
FIG. 3 is a block diagram illustrating an example of a memory unit in the devices illustrated in FIGS. 1 and 2.

FIG. 3 is a block diagram illustrating an example of a memory unit 3000 included in the devices described with reference to FIGS. 1 and 2.

Referring to FIG. 3, the memory unit 3000 may include a memory cell array 3100. The memory cell array 3100 may be, for example, an array of NAND flash memory cells. The NAND flash memory array may include memory strings of serially connected memory cells, for example, 16 or 32 memory cells, and an end portion of the memory strings may be connected to a corresponding bit line via selection transistors. Word lines are extended across each of the memory cells in the memory strings. The memory cells in the memory strings may be read and verified by over-driving the memory cells in the memory strings except an addressed memory cell such that a current flow through the memory strings is dependent on a charge level stored in the addressed memory cell.

The memory unit 3000 may further include peripheral circuits formed around the memory cell array 3100, and the peripheral circuits may be formed on a substrate 3900, on which the memory cell array 3100 is also formed. The peripheral circuits may include charge pumps 3210, 3220, and 3230, sense amplifier 3300, input/output circuits 3400, and row decoder circuits 3500, and may also include, although not illustrated, clock circuits, registers, and logic circuits. The peripheral circuits may be formed in various voltage regions 3600, 3700, and 3800 and may be operated at different operational voltages.

For example, operations of the NAND flash memory may include reading, programming, and erasing operations Thus, the charge pumps 3210, 3220 and 3230 may be required to operate at different operational voltages. The reading operation may be performed at a voltage of about 5V or less, and may be performed, for example, by a charge pump that can manage a middle voltage. The programming operation may be performed at a voltage of about 7V to 20V, and may be performed by a charge pump that can manage a high voltage. Also, the erasing operation may be performed at a voltage of about 20V, and may be performed by a charge pump that can manage a high voltage. In FIG. 3, one charge pump 3210 formed in a middle voltage region 3700 to be used for the reading operation, and two charge pumps 3220 and 3230 formed in a high voltage region 3800 for the programming operation and the erasing operation are illustrated.

With respect to the row decoder circuits 3500 and the sense amplifier 3300 that are adjacent to the memory cell array 3100, the row decoder circuits 3500 are usually formed in the high voltage region, and the sense amplifier 3300 is usually formed in a low voltage region. The logic circuits and the input/output circuits are operated at a voltage of about 1.5V, and are formed in the low voltage region. The amplitude and number of operational voltages of the above-described various circuits are exemplary and are not limited thereto.

As described above with reference to FIGS. 1 through 3, various circuits operating at various operational voltages may be formed on a single substrate. The circuits may be metal oxide semiconductor field effect transistors (MOSFETs), and thicknesses of gate dielectric materials formed in each of the voltage regions may vary so as to obtain different threshold voltages. For example, because pump circuits such as the charge pumps 3210, 3220, and 3230 operates at higher voltages than the logic circuits such as the input/output circuits 3400, and thus the pump circuits may require a thicker gate insulating layer than the logic circuits for improving reliability.

In the above-described embodiment, a memory unit is described as a semiconductor device having various operational voltages, but the inventive concept is not limited thereto. Examples of the semiconductor device include a logic device, a digital signal processor, a driver of a display or a motor, various circuits such as a sensor, and/or a combination of these.

Figure 4A:
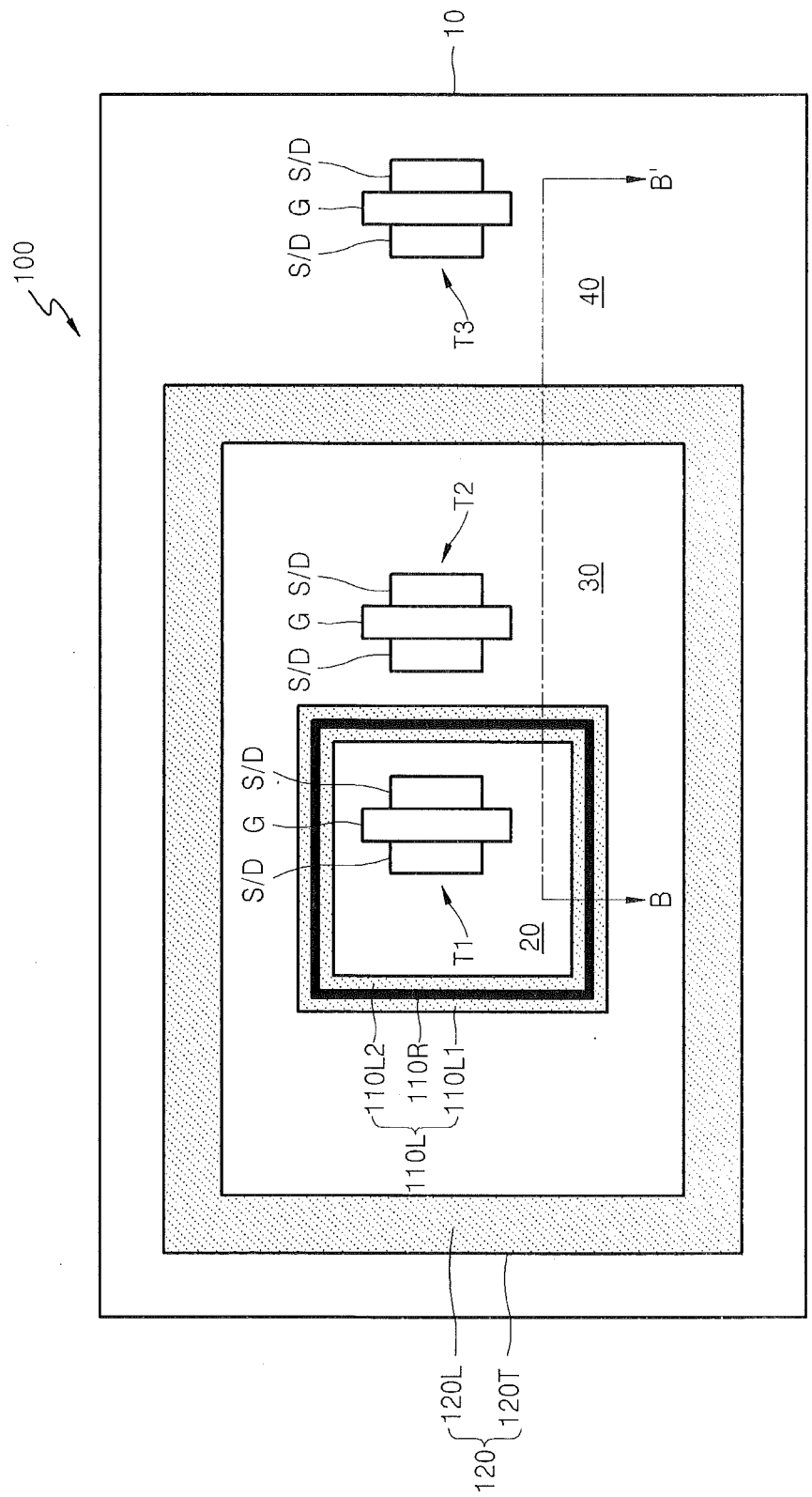
FIG. 4A is a plan view illustrating a semiconductor device including a device isolation layer structure, according to some embodiments of the inventive concept.
Figure 4B:
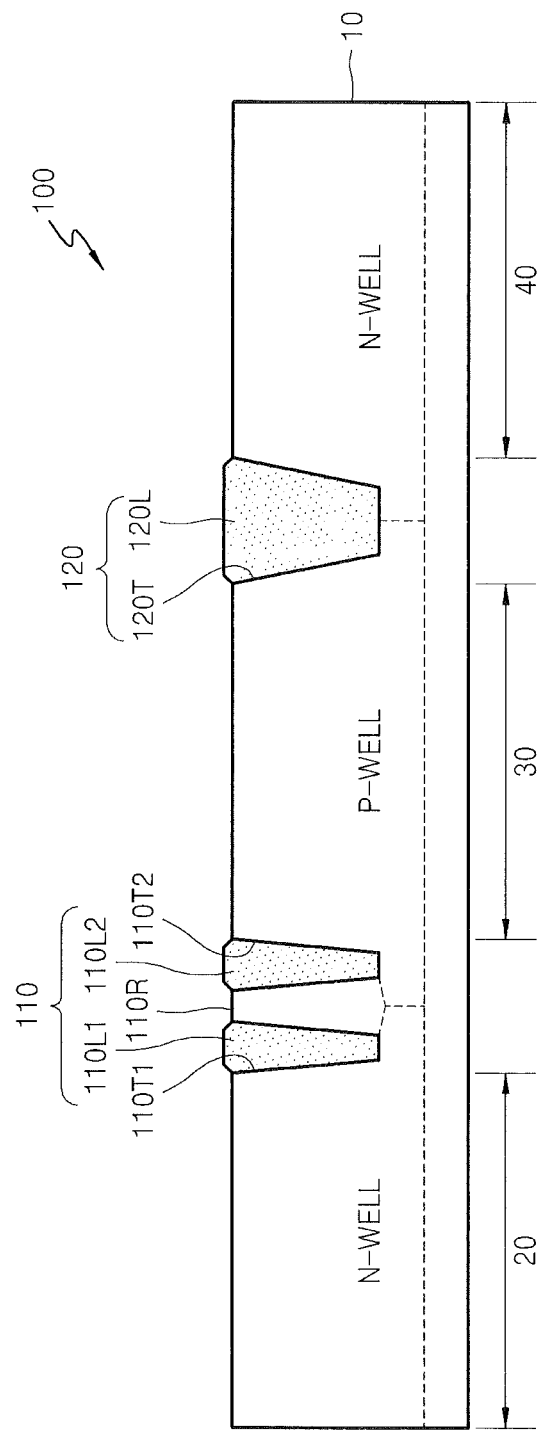
FIG. 4B is a cross-sectional view illustrating the semiconductor device cut along a B-B' line of FIG. 4A.

FIG. 4A is a plan view illustrating a semiconductor device 100 including device isolation layer structures 110 and 120, according to an example embodiment of the inventive concept, and FIG. 4B is a cross-sectional view illustrating the semiconductor device 100 along a B-B' line of FIG. 4A.

Referring to FIGS. 4A and 4B, various voltage regions, for example, low, middle, and high voltage regions, may be formed on a semiconductor substrate 10. As discussed herein, a "middle" voltage region includes devices having an operational voltage that is greater than that of devices in the low voltage region, but less than that of devices in the high voltage region. As illustrated in FIG. 4A, the middle voltage region may be formed in a portion of the low voltage region, and the low voltage region may be formed in a portion of the high voltage region. However, the embodiment is exemplary and the configuration of the voltage regions may vary according to the type of the semiconductor device 100. For example, the low voltage region may be disposed in the portion of the middle voltage region, alternatively, the low voltage region and the middle voltage region may be evenly disposed on the semiconductor substrate 10 without being included in one another. In addition, the semiconductor device 100 may include only two different voltage regions among the low, middle, and high voltage regions, or may further include a fourth voltage region.

In some embodiments, the semiconductor substrate 10 may include at least one p-type well and/or n-type well, as illustrated with a dotted line in FIG. 4B. The wells may be formed before or after forming the device isolation layer structures 110 and 120. Although not illustrated in FIGS. 4A and 4B, in order to make semiconductor device 100 more compact, a low voltage region 30 and a middle voltage region 20 may be formed in the same type well so that a separation distance between the low voltage region 30 and the middle voltage region 20 is minimized. For example, the low voltage region 30 and the middle voltage region 20 may be formed in a p-type well.

In each of the voltage regions, NMOSFETs and/or PMOSFETs T1, T2, and T3 including a source/drain (S/D) and a gate (G) may be formed. The transistors T1, T2, and T3 may be planar transistors, but are not limited thereto, and may also be a trench type gate transistor or a three-dimensional (3D) transistor having a PIN (positive-intrinsic-negative)-type structure for mitigating short channel effects.

The voltage regions 20, 30 and 40 are electrically separated from one another by the device isolation layer structures 110 and 120. As illustrated in FIG. 4B, the device isolation layer structure 110 that separates the middle voltage region 20 and the low voltage region 30 includes first and second trenches 110T1 and 110T2 that are separated from each other by a predetermined distance, and electrically insulating layers 110L1 and 110L2 are respectively buried in the first and second trenches 110T1 and 110T2. A guard ring region 110R is disposed between the separated first and second trenches 110T1 and 110T2. The guard ring region 110R may be a portion of the semiconductor substrate 10 as illustrated in FIG. 4B. The guard ring region 110R may have a different conductivity type from a well thereunder and thus the guard ring region 110R may provide junction isolation.

A width of the guard ring region 110R is defined by a separation distance D between the first and second trenches 110T1 and 110T2, which is the predetermined distance between the first and second trenches 110T1 and 110T2. The separation distance D may be determined based on a margin of a photolithography process that is required in a process of forming a gate insulating layer having various thicknesses of the middle voltage region 20 and the low voltage region 20 as will be described later with reference to FIG. 5B. For example, the separation distance D may be in a range of about 0.2 micrometers (μm) to about 1.0 micrometers (μm).

In order to form gate insulating layers having different thicknesses on the low voltage region 30 and the middle voltage region 20, respectively, one or more photolithography processes and etching processes need to be performed, and thus the device isolation layer 110 including the guard ring region 110R having improved etching selectivity with respect to the gate insulating layers is preferable, and this advantage will be more obvious by referring to the subsequent description of forming a gate insulating layer of FIGS. 6A through 6E and FIGS. 7A and 7B.

The device isolation layer 120 that separates the low voltage region 30 and a high voltage region 40 may be a shallow trench isolation (STI) layer including a third trench 120T and an electrically insulating layer 120L formed in the third trench 120T as are well known in the art. In FIGS. 4A and 4B, the device isolation layer 110 selectively includes a guard ring region 110R exclusively between the low voltage region 30 and the middle voltage region 20 for making the semiconductor device 100 more compact. However, the embodiment of the inventive concept is not limited thereto, and the device isolation layer structure 120 that separates the low voltage region 30 and the high voltage region 40 may include two separate trenches 110T1 and 110T2 and a guard ring region 110R like the device isolation layer structure 110 that separates the low voltage region 30 and the middle voltage region 20. Also, although not illustrated in FIGS. 4A and 4B, when the middle voltage region 20 and the high voltage region 40 are adjacent to each other, the device isolation layer structure 110 including the guard ring region 110R may be applied.

In some embodiments, the first and second trenches 110T1 and 110T2 and the third trench 120T may have different widths, but are not limited thereto, and the trenches 110T1, 110T2, and 120T may have the same width. For example, the width of the first and second trenches 110T1 and 110T2 may be in a range of about 0.2 micrometers (μm) to about 0.5 micrometers (μm), and the width of the third trench 120T may be about 2.0 micrometers (μm). Alternatively, the widths of the first through third trenches 110T1, 110T2, and 120T may be in a range of about 0.2 micrometers (μm) to about 2.0 micrometers (μm). Also, the widths of the first and second trenches 110T1 and 110T2 may be the same or different.

FIGS. 5A through 5E are cross-sectional views illustrating a method of manufacturing the device isolation layer structures 110 and 120 according to an example embodiment of the inventive concept.

Figure 5A:
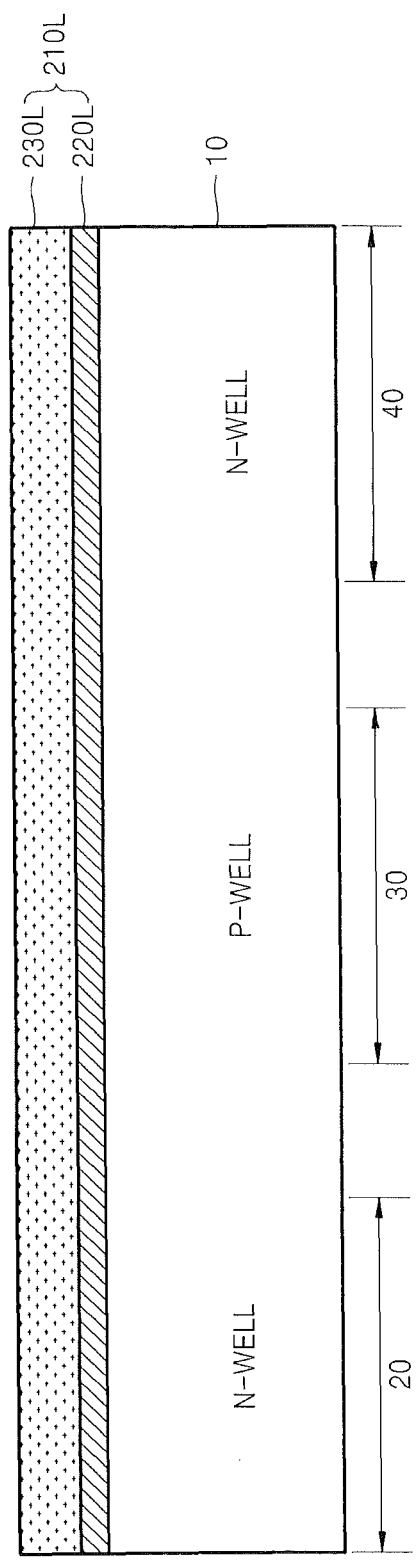
FIGS. 5A through 5E are cross-sectional views illustrating a method of manufacturing a device isolation layer structure, according to some embodiments of the inventive concept.

Referring to FIG. 5A, a semiconductor substrate 10 is provided, in an upper portion of which various voltage regions, for example, a middle voltage region, a low voltage region, and a high voltage region, are to be formed. A mask layer 210L is formed on the semiconductor substrate 10. The mask layer 210L may include a silicon nitride layer 230L formed by a low pressure chemical vapor deposition (LPCVD). In some embodiments, a pad oxide layer 220L may be further formed before forming the silicon nitride layer 230L.

Figure 5B:
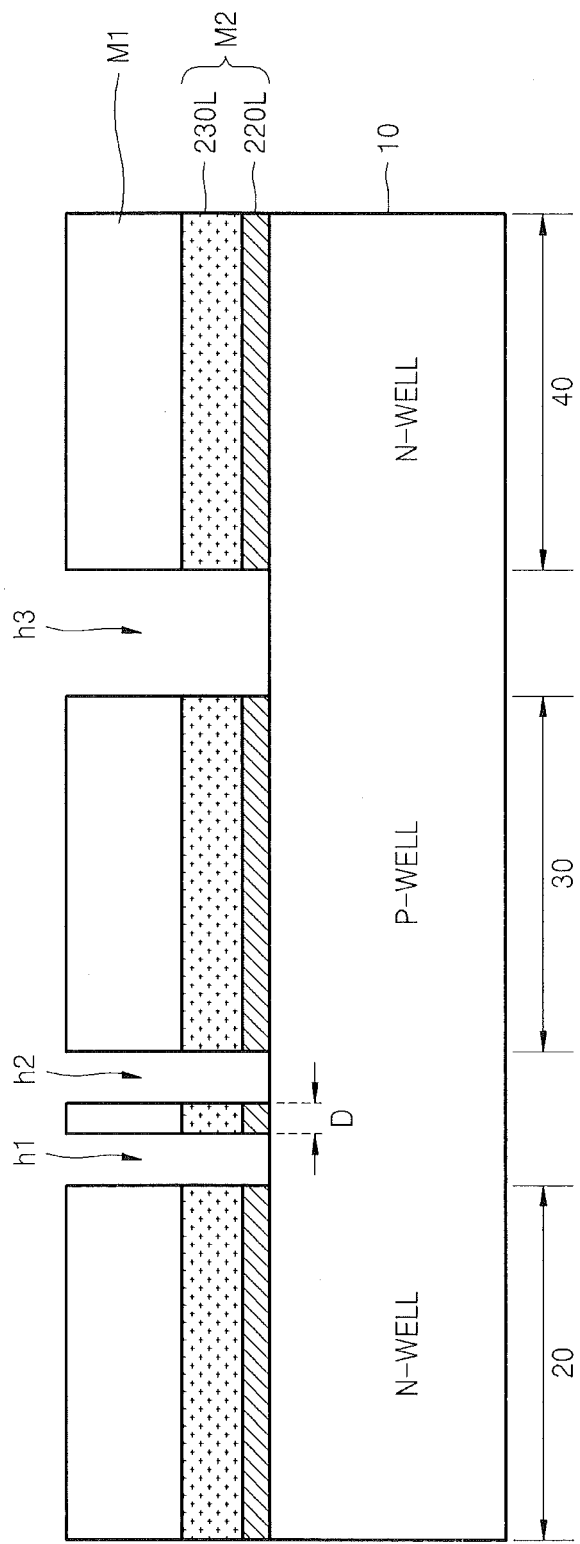

Referring to FIG. 5B, after forming a photoresist pattern M1 on the mask layer 210L by photolithography, the mask layer 210L is then patterned to form a first mask pattern M2 having first through third opening portions h1, h2, and h3 exposing a surface of the semiconductor substrate 10 on which the trenches 110T1, 110T2, and 120T of the device isolation layer structures 110 and 120 for electrically separating the voltage regions 20, 30 and 40 are formed. In order to provide a guard ring region in the device isolation layer structures 110 and 120 between the middle voltage region 20 and the low voltage region 30, the first and second opening portions h1 and h2 may be separated apart by the separation distance D corresponding to the width of the guard ring region 110R.

Figure 5C:
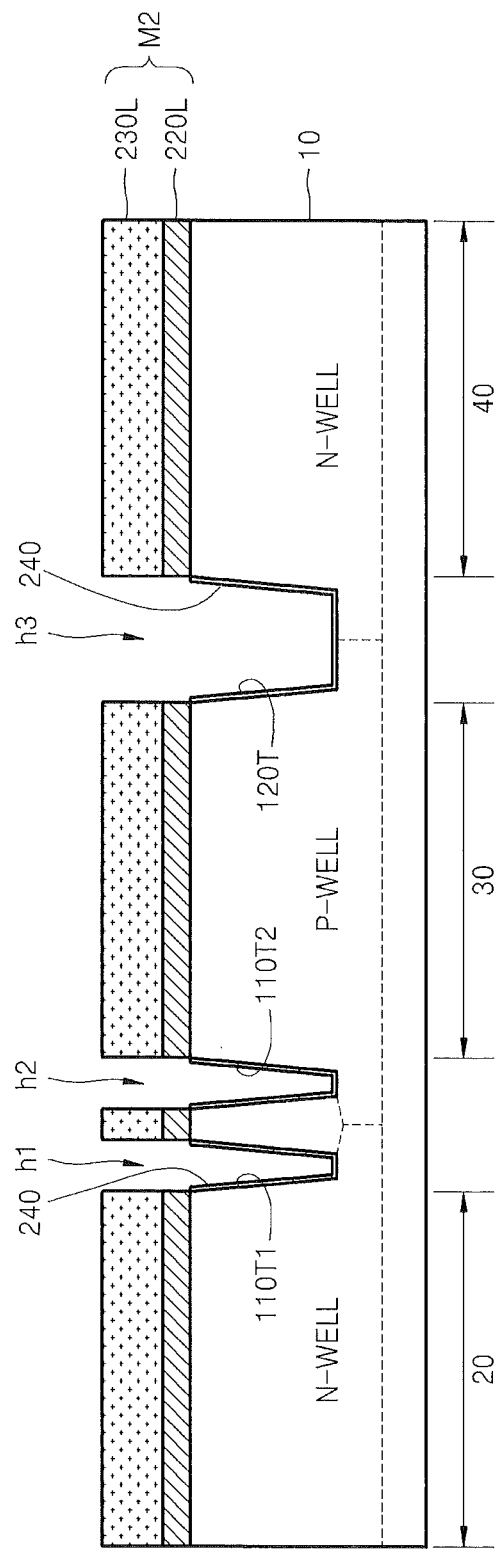

Referring to FIG. 5C, the photoresist pattern M1 is removed, and a first mask pattern M2 is used as an etching mask to etch the exposed surface of the semiconductor substrate 10 to form the trenches 110T1, 110T2, and 120T. The trenches 110T1, 110T2, and 120T may be formed by a plasma dry etching using mixed gas such as $HBr/Cr_2/O_2$. Selectively, the photoresist pattern M1 for forming the first mask pattern M2 may not be removed but may be used to form the trenches 110T1, 110T2, and 120T. The trenches 110T1, 110T2, and 120T may have depths of about 3000 Å to about 5000 Å. Then, in some embodiments, a shallow thermal oxide layer 240 may be further formed on inner walls of the trenches 110T1, 110T2, and 120T.

Figure 5D:
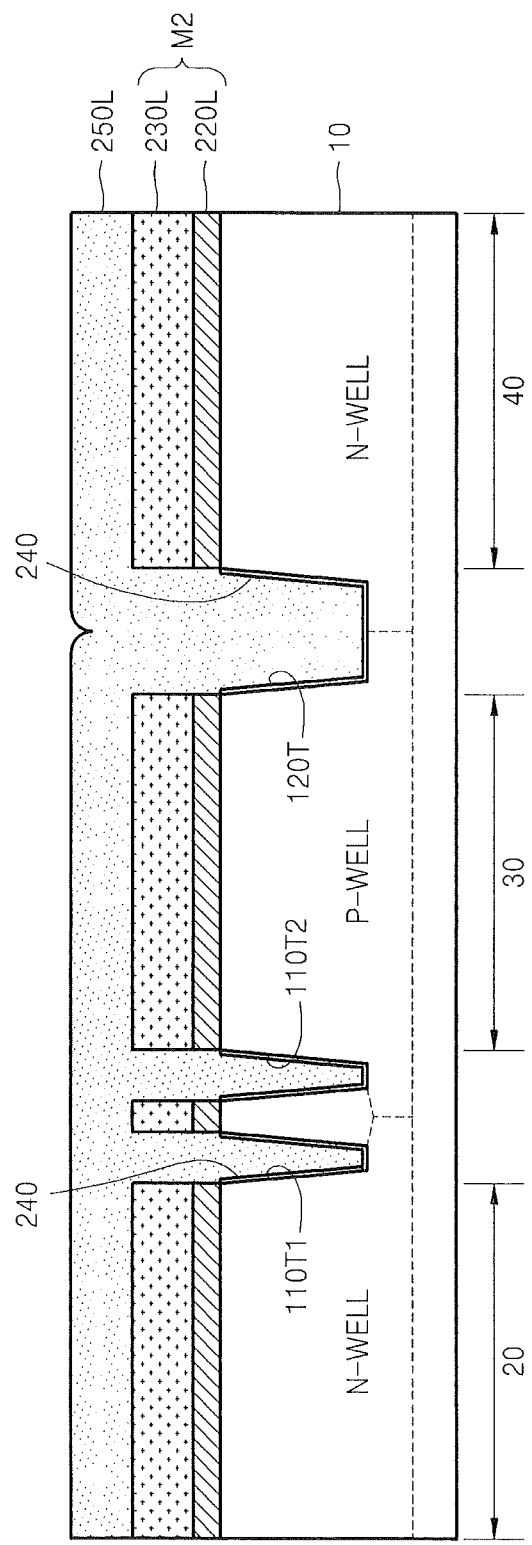

Referring to FIG. 5D, an electrically insulating layer 250L is formed on the semiconductor substrate 10 so as to fill the trenches 110T1, 110T2, and 120T. The electrically insulating layer 250L may be a silicon oxide layer that is formed using a high density plasma chemical vapor deposition method which may effectively fill gaps such as the trenches.

Figure 5E:
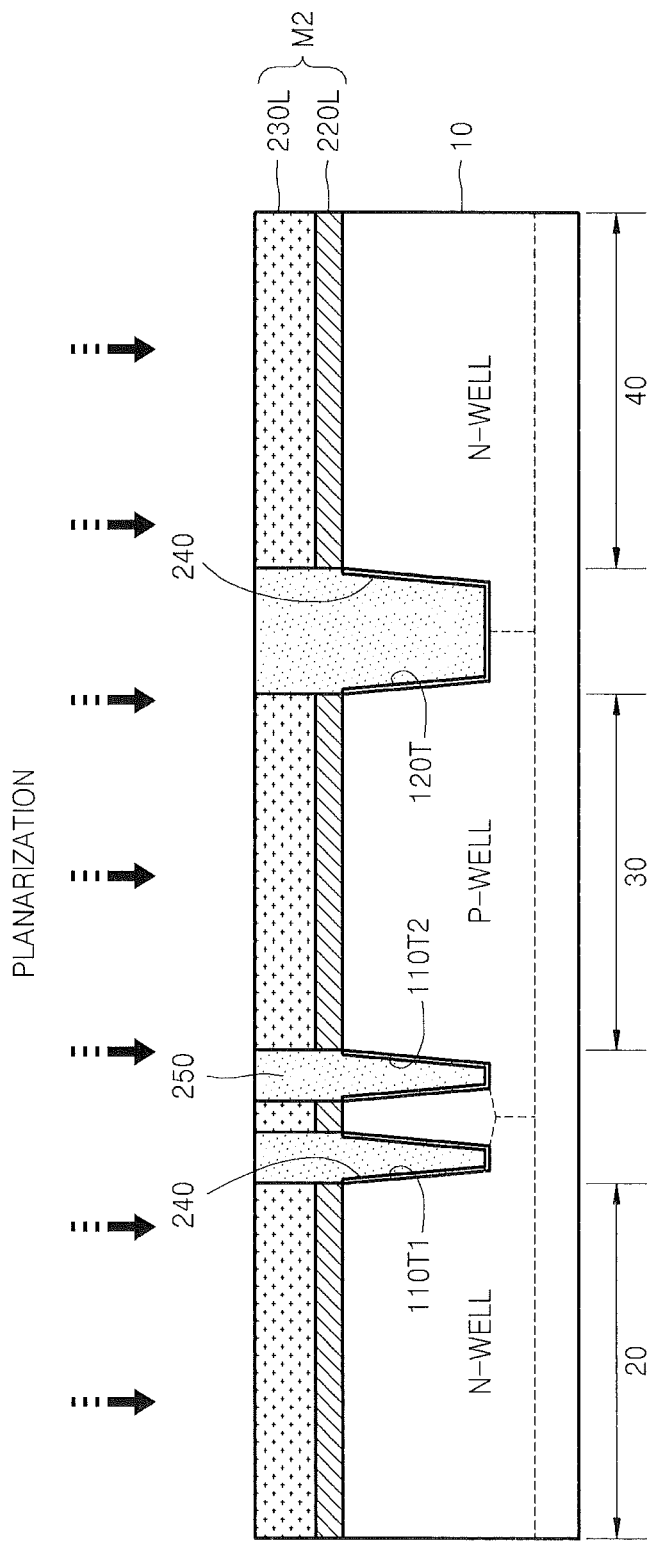

Referring to FIG. 5E, the electrically insulating layer 250L is planarized until a surface of the first mask pattern M2 is exposed. The planarization process may be a chemical mechanical polishing (CMP) process or an etchback process using plasma. Then, at a temperature of about 900° C., the semiconductor substrate 10 is annealed to densify the planarized electrically insulating layer 250L. Subsequently, the first mask pattern M2 is removed by a wet etching process using phosphoric acid ($H_3PO_4$), as illustrated in FIG. 4B, a device isolation layer structure 110 having a guard ring region 110R formed of a portion of the semiconductor substrate 10 between the middle voltage region 20 and the low voltage region 30 may be obtained, and a device isolation layer structure 120 according to the conventional art may be formed between the low voltage region 30 and the high voltage region 40. Selectively, the first mask pattern M2 may be removed, and then a densification process may be performed on the electrically insulating layer 250L.

FIGS. 6A through 6E are cross-sectional views illustrating a method of manufacturing a semiconductor device 100, according to an example embodiment of the inventive concept.

Figure 6A:
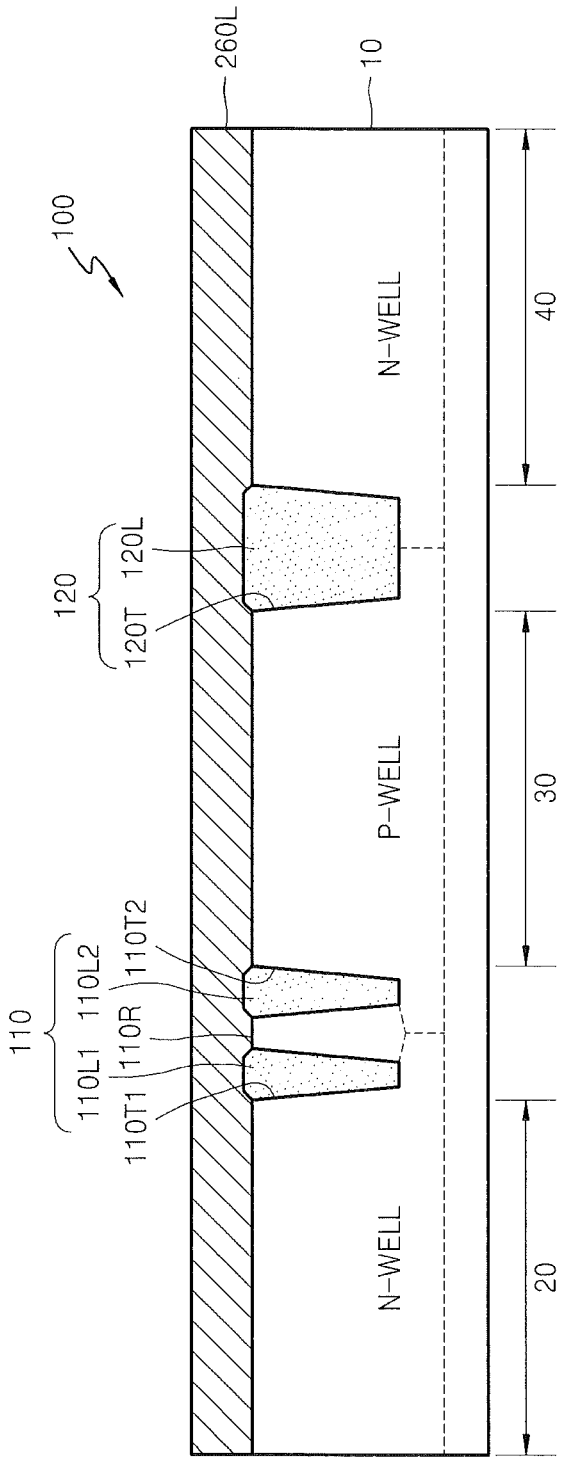
FIGS. 6A through 6E are cross-sectional views illustrating a method of manufacturing a semiconductor device, according to some embodiments of the inventive concept.

Referring to FIG. 6A, a semiconductor substrate 10 having at least one low voltage region 30, at least one middle voltage region 20, and at least one high voltage region 40 is provided. The order and alignment of the illustrated voltage regions are exemplary, and are not limited thereto. The voltage regions 20, 30 and 40 are electrically separated by the device isolation layer structures 110 and 120 as described above with reference to FIG. 4B.

A first dielectric layer 260L is formed on a surface of the semiconductor substrate 10 of the low voltage region 30, the middle voltage region 20, and the high voltage region 40. The first dielectric layer 260L is thick and is to be formed as a first gate insulating layer 260 (see FIG. 6E) of the high voltage region 40. The first dielectric layer 260L may be formed by a thermal oxidization or a CVD. The first dielectric layer 260L may be a thickness of about 300 Å and about 900 Å, and the first dielectric layer 260L may have formed using a silicon oxide. However, the example embodiment of the inventive concept is not limited thereto. The first dielectric layer 260L may also be formed using dielectric materials other than silicon oxide.

Figure 6B:
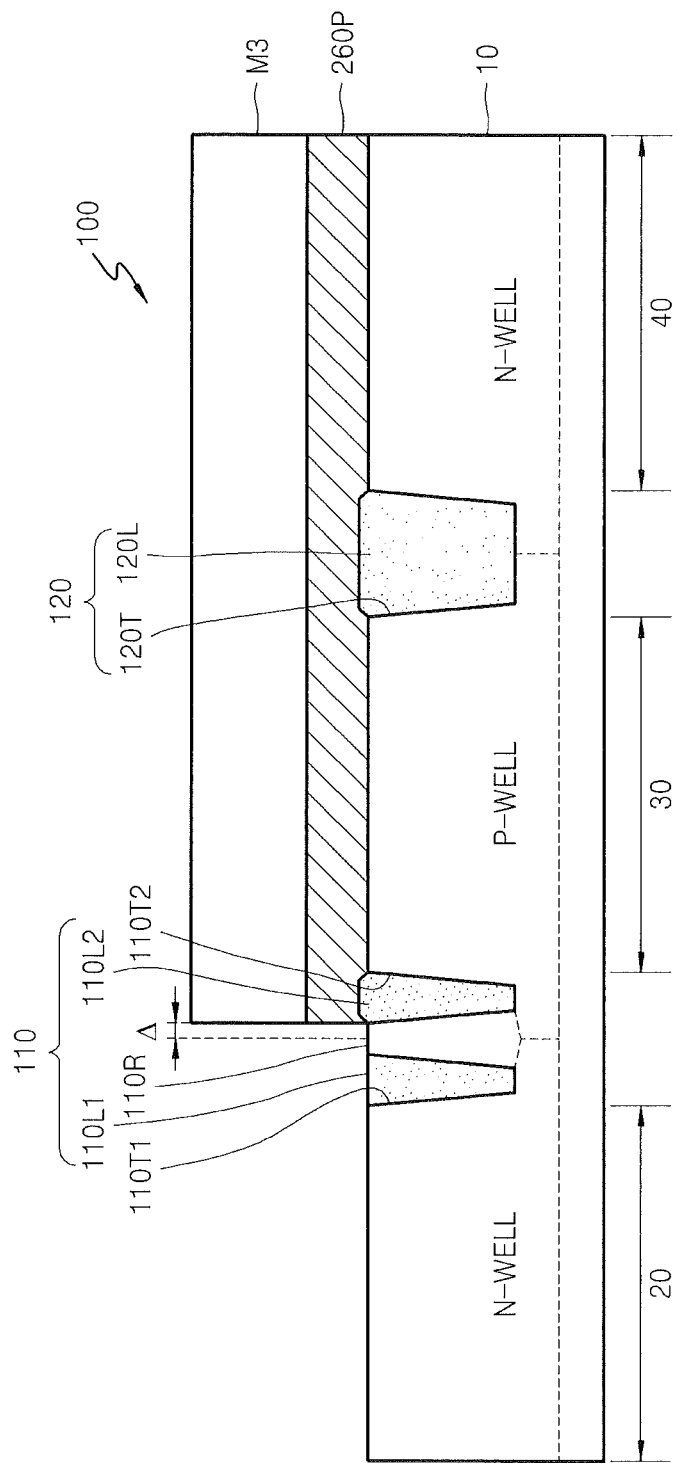

Referring to FIG. 6B, at least a portion of the first dielectric layer 260L on the middle voltage region 20 is removed, and a first dielectric layer pattern 260P is formed on the low voltage region and the high voltage region. For example, a first photoresist pattern M3 is formed on the first dielectric layer 260L by the photolithography, and a first dielectric layer pattern 260P may be formed by a dry etching using plasma or a wet etching using hydrofluoric acid (HF). A boundary portion of the first photoresist pattern M3 may be located on the guard ring region 110R. Then, the first photoresist pattern M3 is removed.

For example, while the first dielectric layer pattern 260P is formed, the device isolation layer structure 110 between the middle voltage region 20 and the low voltage region 20 is at least partially exposed during patterning the first dielectric layer 260L, and thus, as illustrated in FIG. 6B, an upper surface of the electrically insulating layer 110L1 in the first trench 110T1 of the device isolation layer structure 110 may be removed along with the first dielectric layer 260L. However, since the upper surface of the electrically insulating layer 110L1 is etched to be substantially planar, it may not act as a pollution source. On the other hand, the guard ring region 110R has a higher etch selectivity over the first dielectric layer 260L compared to the electrically insulating layer 110L1 of the device isolation layer structure 110, and thus the guard ring region 110R is not substantially etched during patterning the first dielectric layer 260L.

Referring to FIG. 6B, in order to illustrate possible alignment error of the photolithography process for forming the first photoresist pattern M3, it should be noted that a left boundary portion of the first photoresist pattern M3 is located not exactly in a center of the guard ring region 110R but deviated slightly toward a right side such that a portion of a surface of the guard ring region 110R is exposed. If the device isolation layer structure 110 that electrically separates the middle voltage region 20 and the low voltage region 30 were a conventional STI device isolation layer structure which does not include the guard ring region 110R, not only the upper surface of the first electrically insulating layer 110L1 but also a center portion of the STI device isolation layer may be etched and/or corroded.

Figure 6C:
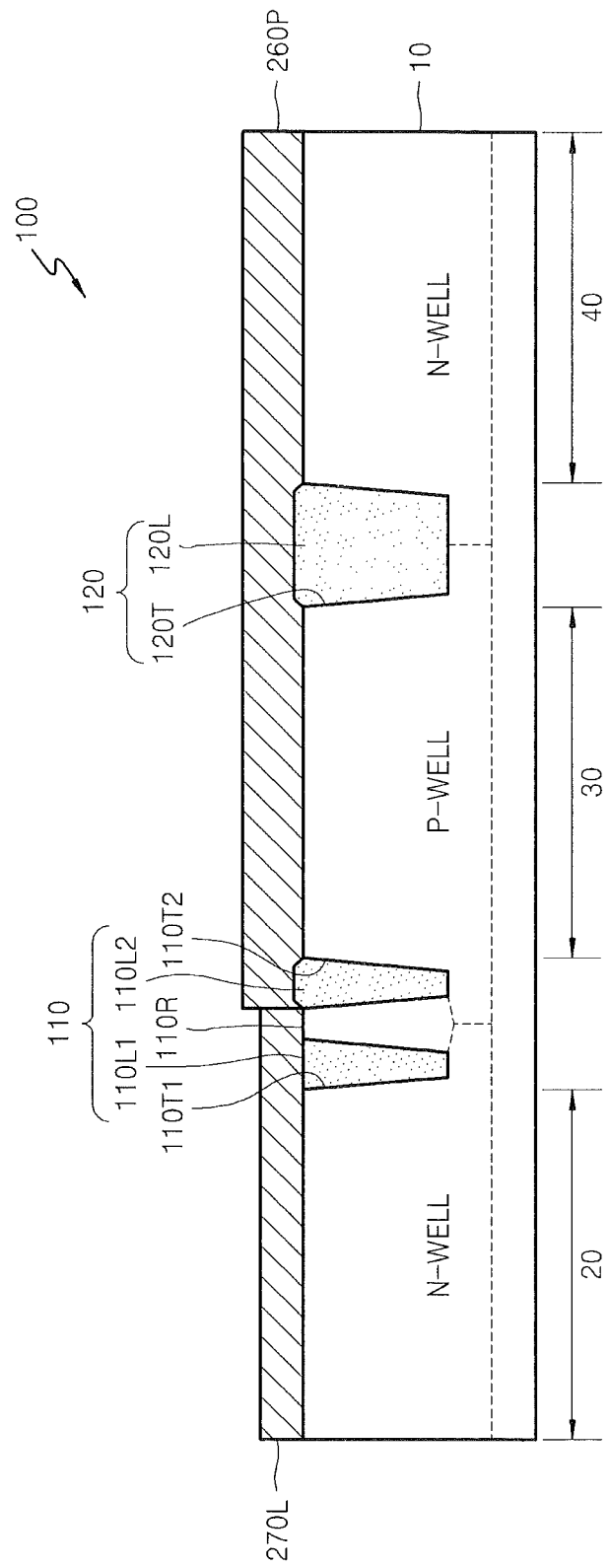

Next, referring to FIG. 6C, a second dielectric layer 270L which is to be formed as a second gate insulating layer 270 (see FIG. 6E) which is thinner than the first gate insulating layer 260 is formed on the middle voltage region 20. The second dielectric layer 270L may be formed by thermally oxidizing or performing chemical vapor deposition on the surface of the semiconductor substrate 10 of the exposed middle voltage region 20. During the thermal oxidization or CVD operations, the first dielectric layer pattern 260P may be further oxidized to become thicker. The thickness of the second dielectric layer 270L may be in a range of about 50 Å to about 300 Å, and a boundary portion between the second dielectric layer 270L and a third dielectric layer 280 (see FIG. 6E) which is to be formed later may be located on the guard ring region 110R.

Figure 6D:
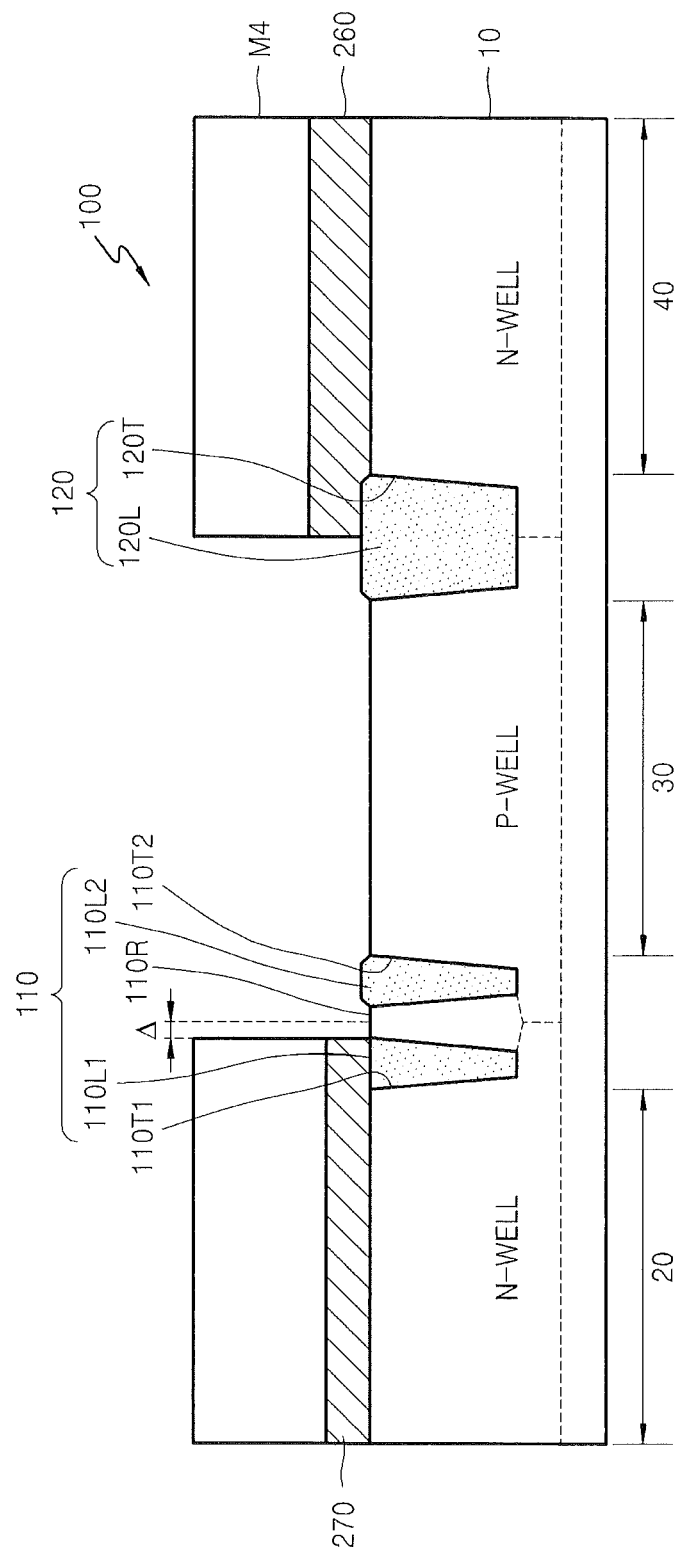

Referring to FIG. 6D, a portion of the first dielectric layer pattern 260P on the low voltage region 30 is selectively removed, and a first gate insulating layer 260 on the high voltage region 40 and a second gate insulating layer 270 on the middle voltage region 20 are formed. For example, a second photoresist pattern M4 is formed on the second dielectric layer 270L on the middle voltage region 20 and the first dielectric layer pattern 260P on the low voltage region 30. The second photoresist pattern M4 may be formed by performing a photolithography process, a dry etching process using plasma, and a wet etching process using hydrofluoric acid (HF). Then, the second photoresist pattern M4 is removed.

Like in the example embodiment of FIG. 6B, in order to illustrate possible alignment error of the photolithography process for forming the second photoresist pattern M4, it should be noted that a right boundary portion of the second photoresist pattern M4 is located not exactly in a center of the guard ring region 110R but deviated slightly toward a left side. When the device isolation layer structure 110 that electrically separates the middle voltage region 20 and the low voltage region 30 is a conventional STI device isolation layer structure which does not include the guard ring region 110R, a portion of the STI device separation layer may be etched and/or corroded and the rest thereof may act as a pollution source in subsequent processes.

However, in the device isolation layer structure 110 according to the current embodiment of the inventive concept, since the guard ring region 110R has an higher etching selectivity with respect to the first dielectric layer 260L compared to the electrically insulating layers 110L1 and 110L2 of the device isolation layer structure 110, a surface of a center portion of the device isolation layer structure 110 is not substantially etched and/or corroded during patterning the first dielectric layer 260L. Accordingly, the device isolation layer structure 110 included in the semiconductor device 100 according to the current embodiment may have a substantially planar structure such that the upper surface of the electrically insulating layers 110L1 and 110L2 buried in the first and second trenches 110T1 and 110T2, and an upper surface of the guard ring region 110R are on the same horizontal plane.

Figure 6E:
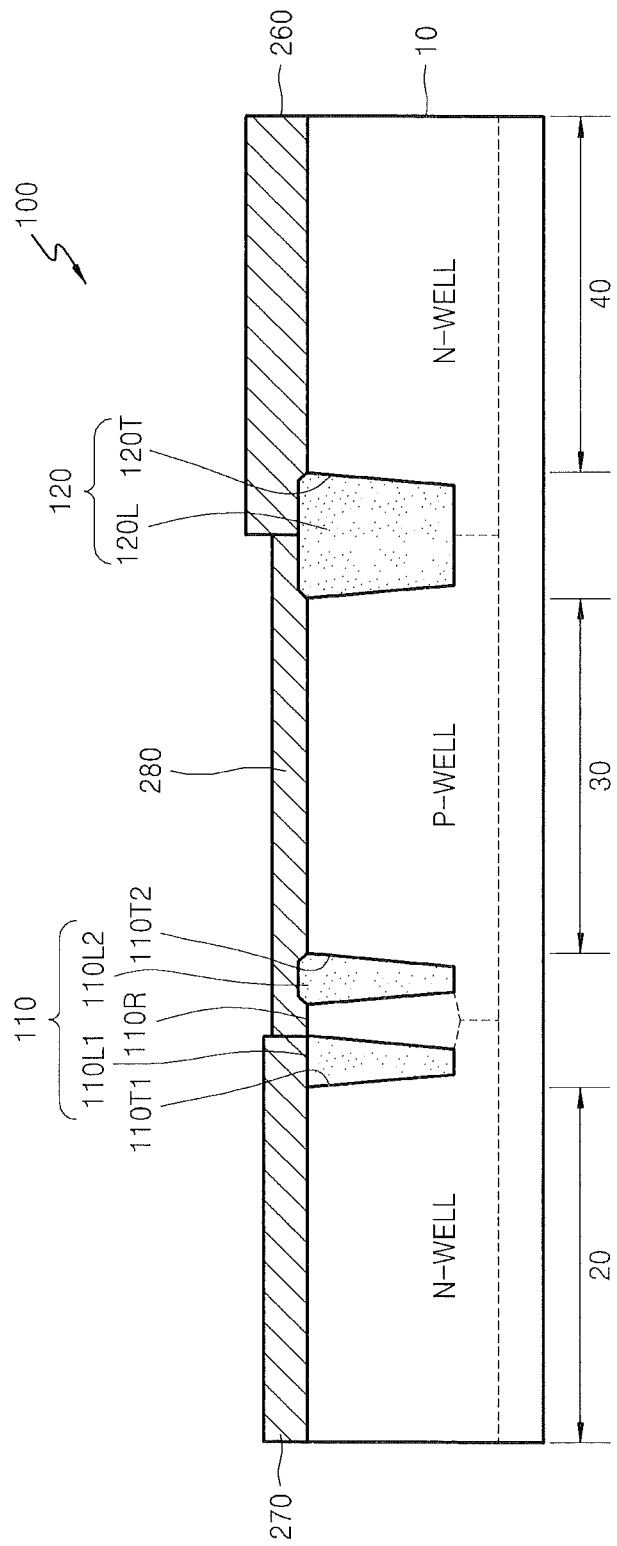

Next, referring to FIG. 6E, a third dielectric layer, which is to be formed as a third gate insulating layer 280 and which is thinner than the second gate insulating layer 270, is formed on the low voltage region 30. Hereinafter, the third dielectric layer corresponds to the third gate insulating layer 280. The third dielectric layer may be formed by thermally oxidizing or performing chemical vapor deposition on a surface of the semiconductor substrate 10 of the exposed low voltage region 30. During the thermal oxidization or the CVD operations, the first and second gate insulating layers 260 and 270 may be further oxidized to be thicker. The thickness of the third dielectric layer may be in a range of about 20 Å to about 50 Å.

In the above-described embodiments, the first through third dielectric layers formed of silicon oxides are described, but the inventive concept is not limited thereto. For example, at least one of the first through third dielectric layers may include a high-k thin film such as $Al_2O_3$, $HfO_2$, $ZrO_2$, HfSiOx, or ZrSiOx, and/or a stacked dielectric layer such as ONO (oxide-nitride-oxide) layers.

A conductive layer such as polysilicon or metal, and a capping layer such as a silicon nitride layer may be formed on the first through third gate insulating layers 260, 270, and 280 (not shown). Next, the conductive layer and the capping layer are patterned to form at least one gate electrode with respect to each voltage region 20, 30 and 40, and impurities are implanted to form FETs that are driven at different operational voltages respectively on the low voltage region 30, the middle voltage region 20, and the high voltage region 40.

Figure 7A:
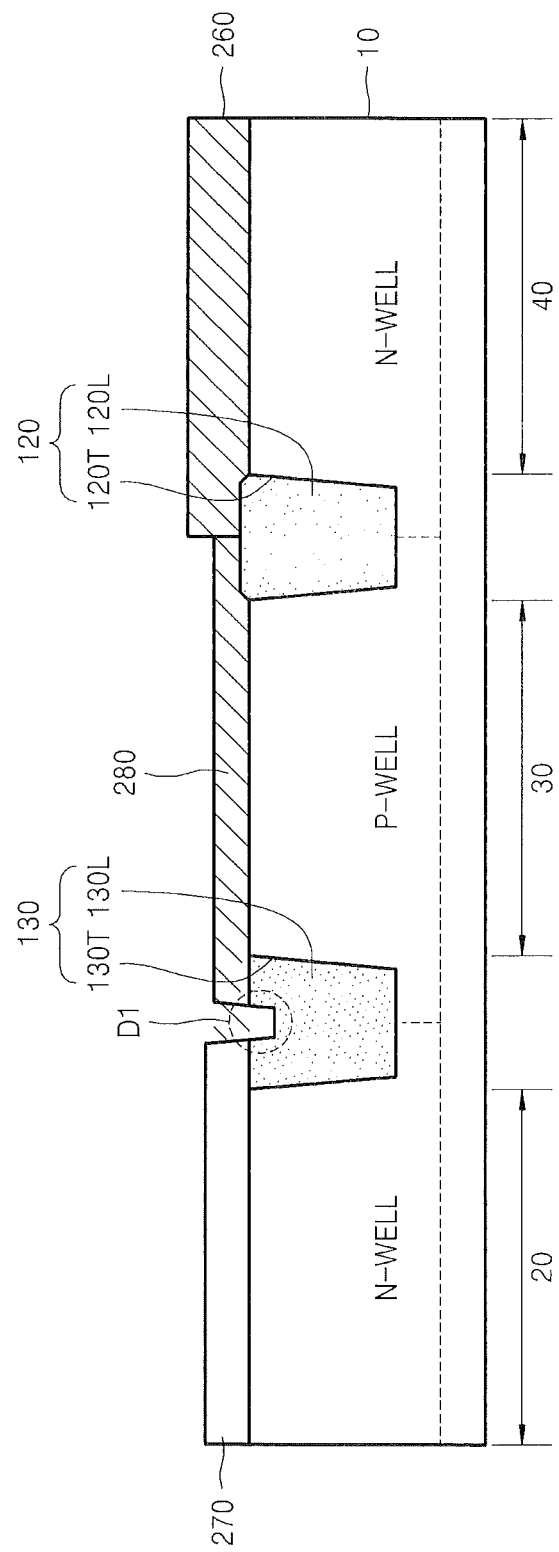
FIGS. 7A and 7B are cross-sectional views qualitatively illustrating topology deformation of an upper surface of a conventional device isolation layer structure in which a middle voltage region and a low voltage region are separated according to an alignment error of a photolithography process, according to a comparative example.
Figure 7B:
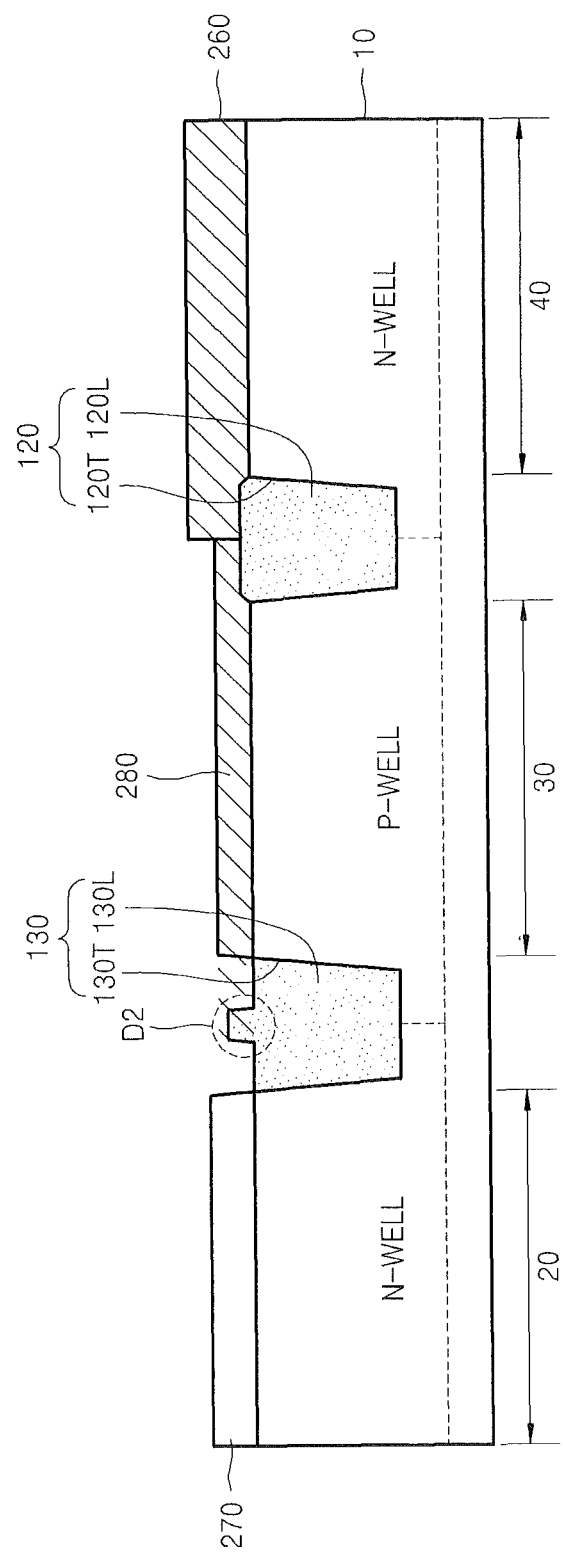

FIGS. 7A and 7B are cross-sectional views qualitatively illustrating topology deformation of an upper surface of a conventional device isolation layer structure 130 by which a middle voltage region 20 and a low voltage region 30 are separated according to an alignment error of a photolithography process. The conventional device isolation layer structure 130 includes a trench 130T formed in a semiconductor substrate 10 and an electrically insulating layer 130L buried in the trench 130T.

As described above with reference to FIGS. 6B through 6D, when an upper surface of a center portion of the device isolation layer structure 130 is repeatedly exposed during each etching process with respect to the first dielectric layer 260L and the second dielectric layer 270L due to the alignment error of the photolithography process for forming first and second photoresist patterns M3 and M4. A portion of the upper surface of the center portion of the device isolation layer structure 130 is repeatedly damaged, further recessed compared to a boundary portion thereof, and thus a dent defect (D1) may be generated as illustrated in FIG. 7A. In this case, undesired impurities may be buried in the dent defect (D1) in a subsequent operation for forming a gate electrode and the dent defect (D1) may cause electric short or act as a source of impurities which decreases the yield and the reliability of the semiconductor device 100. However, due to the device isolation layer structures 110 and 120 according to the inventive concept, as illustrated in FIG. 6E, a dent defect is not generated on the upper surface of the center portion of the device isolation layer structures 110 and 120.

Hereinafter, a different alignment error of the photolithography process is assumed with reference to FIGS. 6B through 6D. For example, a left boundary portion of the first photoresist pattern M3 of FIG. 6B may be not exactly in the center of the device isolation layer structure 130 but slightly deviate to a left side. Also, a right boundary portion of the second photoresist pattern M4 may be not exactly in the center of the device isolation layer structure 130 but deviate slightly toward a right side. In this case, an upper surface of the center portion of the device isolation layer structure 130 is not exposed at all during the etching process of the first dielectric layer 260L and the second dielectric layer 270L, and thus as illustrated in FIG. 7B, the upper surface may protrude further compared to another upper surface of the device isolation layer structure 130 that is corroded. A protrusion D2 of the upper surface of the center portion of the device isolation layer structure 130 may act as a source of impurities in subsequent processes.

However, according to embodiments of the inventive concept, since corrosion of the portion of the surface of the device isolation layer structure 110 is not generated during the etching process of the first dielectric layer 260L, a decrease in device reliability and pollution due to topology deformation of the upper portion of the device isolation layer structure 110 may be reduced or prevented, and the manufacture of a compact semiconductor device may be aided by increasing a margin of the photolithography process.

According to the current embodiment of the inventive concept, a memory card is described, but the inventive concept may be applied in any devices where various voltage levels are used in a chip such as a display driver IC (DDI), a smart card, etc. and/or when gate insulating layers of various thicknesses and/or types may be required.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
    a semiconductor substrate having a first voltage region configured to be driven at a first voltage and a second voltage region disposed adjacent to the first voltage region and configured to be driven at a second voltage;
    a first field effect transistor (FET) on the first voltage region and including a first gate insulating layer having a first thickness;
    a second FET on the second voltage region and including a second gate insulating layer having a second thickness; and
    a device isolation layer structure that electrically separates the first and second voltage regions,
    wherein the device isolation layer structure includes first and second trenches separated by a predetermined distance in the semiconductor substrate, electrically insulating layers respectively provided in the first and second trenches, and a guard ring region extending between the first and second trenches, wherein the guard ring region has a different conductivity type than respective wells of the first and/or second voltage regions.

2. The semiconductor device of claim 1, wherein the guard ring region comprises a portion of the semiconductor substrate between the first and second trenches.

3. The semiconductor device of claim 1, wherein the second voltage is higher than the first voltage, and the second thickness is greater than the first thickness.

4. The semiconductor device of claim 1, wherein the predetermined distance between the first and second trenches is in a range of about 0.2 micrometers (μm) to about 1.0 μm.

5. The semiconductor device of claim 1, wherein the first and second voltage regions are formed in a well of the same conductivity type in the semiconductor substrate.

6. The semiconductor device of claim 1, wherein the semiconductor device comprises one of a logic device, a memory device, a digital signal processor, a driving driver, and a sensor.

7. The semiconductor device of claim 1, wherein a boundary region between the first and second gate insulating layers is on the guard ring region.

8. A semiconductor device comprising:
    a semiconductor substrate including a low voltage region, a middle voltage region, and a high voltage region;
    a low voltage field effect transistor (FET) including a low voltage gate insulating layer on the low voltage region;
    a middle voltage FET including a middle voltage gate insulating layer on the middle voltage region;
    a high voltage FET including a high voltage gate insulating layer on the high voltage region; and
    at least one device isolation layer structure that electrically separates two adjacent regions among the low voltage region, the middle voltage region, and the high voltage region,
    wherein the at least one device isolation layer structure includes first and second trenches separated by a predetermined distance in the semiconductor substrate, electrically insulating layers respectively provided in the first and second trenches, and a guard ring region extending between the first and second trenches.

9. The semiconductor device of claim 8, wherein the device isolation layer structure including the guard ring region is provided between the low voltage region and the middle voltage region.

10. The semiconductor device of claim 8, wherein the guard ring region comprises a portion of the semiconductor substrate between the first and second trenches.

11. The semiconductor device of claim 8, wherein a boundary region between the low voltage gate insulating layer and the middle voltage gate insulating layer is on the guard ring region.

12. The semiconductor device of claim 8, wherein at least one of the low voltage gate insulating layer and the middle voltage gate insulating layer includes a high-k thin film and a dielectric stacking layer.

13. The semiconductor device of claim 8, wherein the middle voltage region is provided in a portion of the low voltage region, and wherein the low voltage region is provided in a portion of the high voltage region.

14. A semiconductor device comprising:
a semiconductor substrate having a first voltage region configured to be driven at a first voltage and a second voltage region disposed adjacent to the first voltage region and configured to be driven at a second voltage;
a first field effect transistor (FET) on the first voltage region and including a first gate insulating layer having a first thickness;
a second FET on the second voltage region and including a second gate insulating layer having a second thickness; and
a device isolation layer structure that electrically separates the first and second voltage regions,
wherein the device isolation layer structure includes first and second trenches separated by a predetermined distance in the semiconductor substrate, electrically insulating layers respectively provided in the first and second trenches, and a guard ring region extending between the first and second trenches, wherein the guard ring region has a bottommost surface located on a same or lower level than at least one lowest surface of the first and second trenches.

15. The semiconductor device of claim 14, wherein the second voltage is higher than the first voltage, and the second thickness is greater than the first thickness.

16. The semiconductor device of claim 14, wherein the guard ring region comprises a portion of the semiconductor substrate between the first and second trenches.

* * * * *